(12) United States Patent
Peter et al.

(10) Patent No.: US 12,276,701 B1
(45) Date of Patent: Apr. 15, 2025

(54) INTEGRATED MODULAR SYSTEM FOR HIGH DENSITY, HIGH AMPERAGE TESTING OF BATTERIES WITHIN AN ENVIRONMENTAL TEST CHAMBER

(71) Applicant: Associated Environmental Systems, Inc., Acton, MA (US)

(72) Inventors: Beran Peter, Wayland, MA (US); Brockton Kenyon, Harvard, MA (US)

(73) Assignee: Associated Environmental Systems, Inc., Acton, MA (US)

( * ) Notice: Subject to any disclaimer, the term of this patent is extended or adjusted under 35 U.S.C. 154(b) by 0 days.

(21) Appl. No.: 18/066,217

(22) Filed: Dec. 14, 2022

Related U.S. Application Data

(60) Provisional application No. 63/289,203, filed on Dec. 14, 2021.

(51) Int. Cl.
*G01R 31/36* (2020.01)
*G01R 31/00* (2006.01)
*G01R 31/388* (2019.01)

(52) U.S. Cl.
CPC ....... *G01R 31/3644* (2013.01); *G01R 31/003* (2013.01); *G01R 31/388* (2019.01)

(58) Field of Classification Search
None
See application file for complete search history.

(56) References Cited

U.S. PATENT DOCUMENTS

| 11,397,210 | B1* | 7/2022 | Peter | G01R 31/388 |
| 11,802,914 | B1* | 10/2023 | Peter | G01R 31/3644 |
| 2014/0308557 | A1* | 10/2014 | Ebisawa | H01M 50/503 |
| | | | | 429/99 |

* cited by examiner

*Primary Examiner* — Jermele M Hollington
(74) *Attorney, Agent, or Firm* — Clocktower Law; Erik J Heels; Michael A Bartley

(57) ABSTRACT

The ATP Heavy allows for specific battery types to be easily inserted on shelving that can be configured depending on the battery type and testing needs. In one embodiment these shelves are then manually or pneumatically controlled to safely engage the battery to a connecting plate for connectivity and full power testing. This allows an operator/test technician to safely change the batteries and begin testing without any requirement to disconnect and reconnect external devices and test equipment. Time savings and testing density are optimized in the platform.

12 Claims, 19 Drawing Sheets

INTEGRATED MODULAR SYSTEM FOR HIGH DENSITY, HIGH AMPERAGE TESTING OF BATTERIES WITHIN AN ENVIRONMENTAL TEST CHAMBER

CROSS-REFERENCE TO RELATED APPLICATIONS

This utility patent application claims priority from U.S. provisional patent application Ser. No. 63/289,203, filed Dec. 14, 2021, titled "An Integrated Modular System for High Density, High Amperage Testing of Batteries within an Environmental Test Chamber", naming inventors Beran Peter and Brockton Kenyon.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. Copyright 2022, Associated Environmental Systems.

BACKGROUND

Field of Technology

This relates to testing batteries, and more particularly to a system which increases the safety, density, repeatability and flexibility of testing different types of high amperage batteries under environmental conditions.

Background

Batteries, including those utilized in electric vehicles, need to be tested. Battery behavior such as durability, charge life, charge capacity, and physical expansion across a wide range of temperatures is critical for successful deployment. There are a number of very public issues (e.g., Samsung battery issues with smartphones) that drive the need for testing of batteries across a wide range of environmental conditions. Additionally, battery technologies are migrating into higher amperage as chemistry and use cases increase.

The quantity of batteries that need to be tested is very large. Electric vehicle (EV) sales are increasing rapidly across the globe. The power supply or battery pack for EV's are made up of battery modules which are made up of battery cells, connected together. The chemistry, size, and power of these batteries can be different across different battery vendors. For example, the number of EVs on U.S. roads is projected to reach 18.7 million in 2030, up from 1 million at the end of 2018. The average EV contains 6000 individual batteries connected together to provide power for the vehicle. In addition to EV's, the global high amperage battery market is expected to grow 5-10 times over the next decade. This provides a challenge as to how to best leverage a comprehensive testing environment over the largest quantity of batteries possible.

Additionally, companies who develop and manufacture batteries or Electric vehicle companies that utilize batteries typically have multiple use cases, battery types and sizes that also need to undergo environmental testing. Companies such as Tesla, Lucid, Rivian, Caterpillar, John Deere, and Joby Aviation and every major existing auto manufacturer will utilize batteries of multiple formats. Each of these has a different size, format, power, and type of battery with the same testing requirements.

Environmental test chambers are used to test batteries under a variety of environmental conditions such as extreme heat or cold, or transition between temperatures. They are also used to provide a stable temperature and humidity environment for testing purposes.

Prior solutions available in the market were singular use and purpose built. A single shelf is placed in an environmental test chamber, battery connections are made (depending on the type of battery). Each battery connection is hard wired to a cable that is routed out a hole in the chamber to an external testing device that provides charging and discharging of the battery. Each of those cables might be zip tie wrapped together to try to make it a little neater. The lab technician will try to get as many batteries on the single shelf as possible (perhaps 8-12). Dangerous high amperage batteries make the insertion and connections to batteries inherently dangerous.

After those batteries are tested, the technician will then either need to reach into the chamber and remove the tested batteries and replace them with a new set of batteries, likely having to disconnect and reconnect the interface to the external testing platform.

If a different type of battery is required for testing, the shelf itself, and the battery connection, would need to be replaced.

Time to set up a test per battery, time to test per battery, reconfigurability and safety of the test environment are all critical issues that affect battery testing throughput and have a significant effect on capital equipment costs and requirements needed to achieve battery testing quantities.

U.S. patent application Ser. No. 16/444,685 (titled "System for High Density Testing of Batteries within an Environmental Test Chamber", filed Jun. 18, 2019, now U.S. Pat. No. 11,397,210, naming inventors Beran Peter and Brockton Kenyon), herein fully incorporated by reference, solved some of these problems, teaching an All Test Platform ("ATP") providing a safe and easy way to test batteries and rapidly change batteries and battery types within an environmental test chamber, including:

- The ability to place a high quantity of batteries in the chamber, maximizing test density.
- Interface via swappable circuit boards for connectivity to varying external testing devices.
- Configurability via swappable and interchangeable circuit boards to test different types of batteries.
- Slidable shelving systems that provide ease and safety of battery insertion into the test environment with no external disconnect required.
- A modular system which is easy to use and configure based upon the user requirements.

Testing high amperage batteries adds additional challenges. Typical challenges associated with testing high amperage batteries center around the issues and flexibility associated with safely connecting the heavy gauge wire needed to connect the battery under test with the testing device. As an example, the interconnection needed to support the amperage is typically similar in gauge with an automotive battery cable or a welding cable. Additionally, high amperage batteries may require cooling when deployed to maintain usable lifetime, and the ability to cool the device while testing is often required. Finally, some high amperage batteries need compression plates to control the expansion that may occur during charge and discharge, and the ability to have those controls while under test is important.

Connecting these cables to batteries in a test chamber, where thick gauge cables need to be routed to external devices, and connected to batteries in a secure manner is problematic. Routing cable through a test chamber that is typically conductive needs to be addressed. Batteries tipping over or cable/electrical shorting is a present challenge. Additionally, safely testing more than one battery connected to high amperage thick gauge wiring presents a shorting and safety problem.

With advances in batteries, including chemistry, density, and power, what is still needed is a battery test system with the benefits of the ATP and additional high amperage (up to 1000 amps) handling and testing, and automated movement and connection of batteries within the test chamber.

With high amperage testing, relatively small resistance in the charging circuit will produce a significant amount of heat. If this heat is created at the interface of the cell, it can quickly damage the cell and become a safety hazard. As these high amperage cells are being tested before integration into a larger assembly, they typically have simple terminal pads, and testing requires no permanent modification of the cell. As such, specialized contact methods that provide low resistance and can be adequately cooled are required.

BRIEF SUMMARY

The All Test Platform Heavy (ATP Heavy) provides the highest density per square foot of environmental test chamber space available for high Amperage battery testing. The ATP Heavy combines multiple components critical for battery testing into a configurable, scalable, safe, and high-density battery testing platform.

The ATP Heavy allows for specific battery types to be easily inserted into the fixture that can be configured depending on the battery type and testing needs. These fixtures are then manually or pneumatically controlled to safely connect the battery (ies) to high amperage connection points and support full power testing. This allows an operator/test technician to safely change the batteries and begin testing without any requirement to disconnect and reconnect external devices and test equipment. Time savings, safety, and testing density are optimized in the platform.

Features and Advantages

The ATP Heavy provides:
- A secured, high amperage external connectivity cabling solution/interface.
- A flexible fixture frame to allow for multiple configurations or battery density depending on battery size.
- Connection systems providing precise and safe connectivity of high amperage batteries to high amperage connections within the chamber. In one embodiment these connecting systems are either mechanically or pneumatically actuated, and keep the operator isolated or away from the high amperage connection points.
- High Amperage connection technologies to safely distribute and connect batteries and conduct electricity to an external interface for battery testing devices. Provides a low resistance connection consistently, increasing safety and setup time between tests.

BRIEF DESCRIPTION OF THE DRAWINGS

In the drawings, closely related figures and items have the same number but different alphabetic suffixes. Processes, states, statuses, and databases are named for their respective functions.

DETAILED DESCRIPTION, INCLUDING THE PREFERRED EMBODIMENT

In the following detailed description, reference is made to the accompanying drawings which form a part hereof, and in which are shown, by way of illustration, specific embodiments in which the invention may be practiced. It is to be understood that other embodiments may be used, and structural changes may be made without departing from the scope of the present disclosure.

Operation

The ATP Heavy is a configurable, adjustable fixture that provides safe and easy insertions of multiple, high amperage batteries into an environmental test chamber. Batteries can then be tested under controlled, extreme, and/or varying temperature and humidity conditions.

Figure 1A:
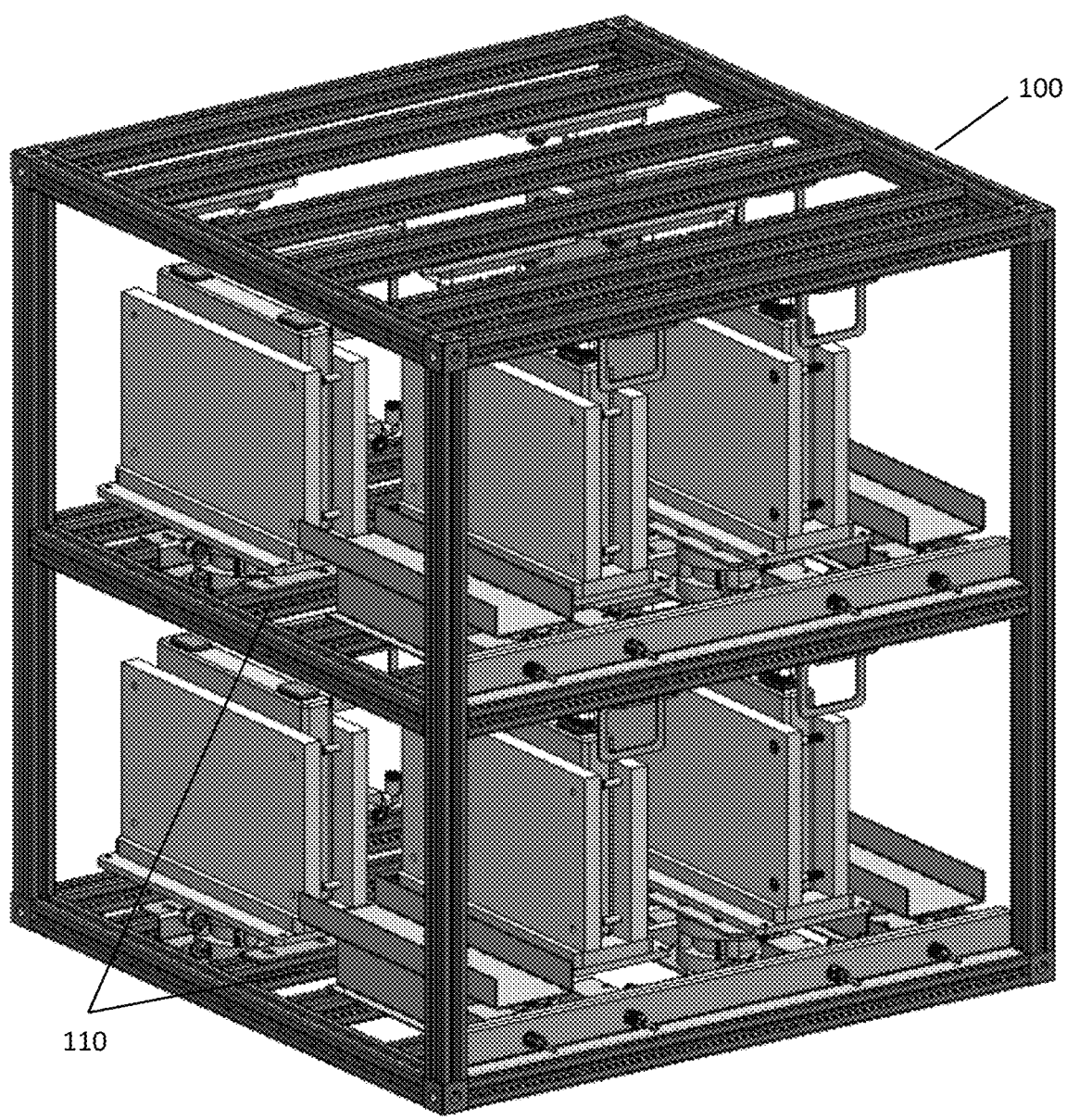
FIG. 1A illustrates an ATP Heavy holding batteries for test
Figure 1B:
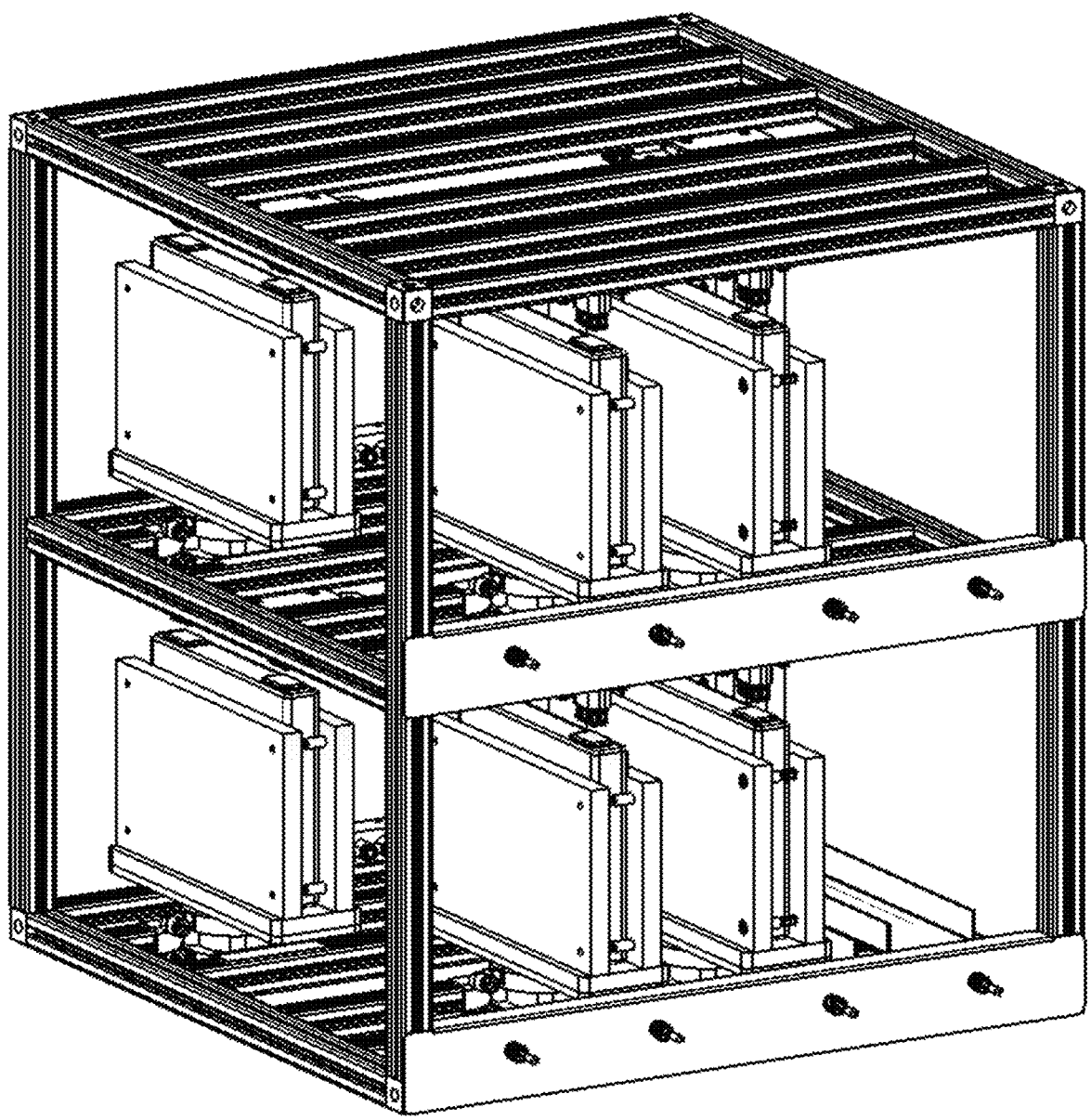
FIG. 1B is a photograph of an ATP Heavy, as illustrated in FIG. 1A, holding batteries for test.
Figure 6:
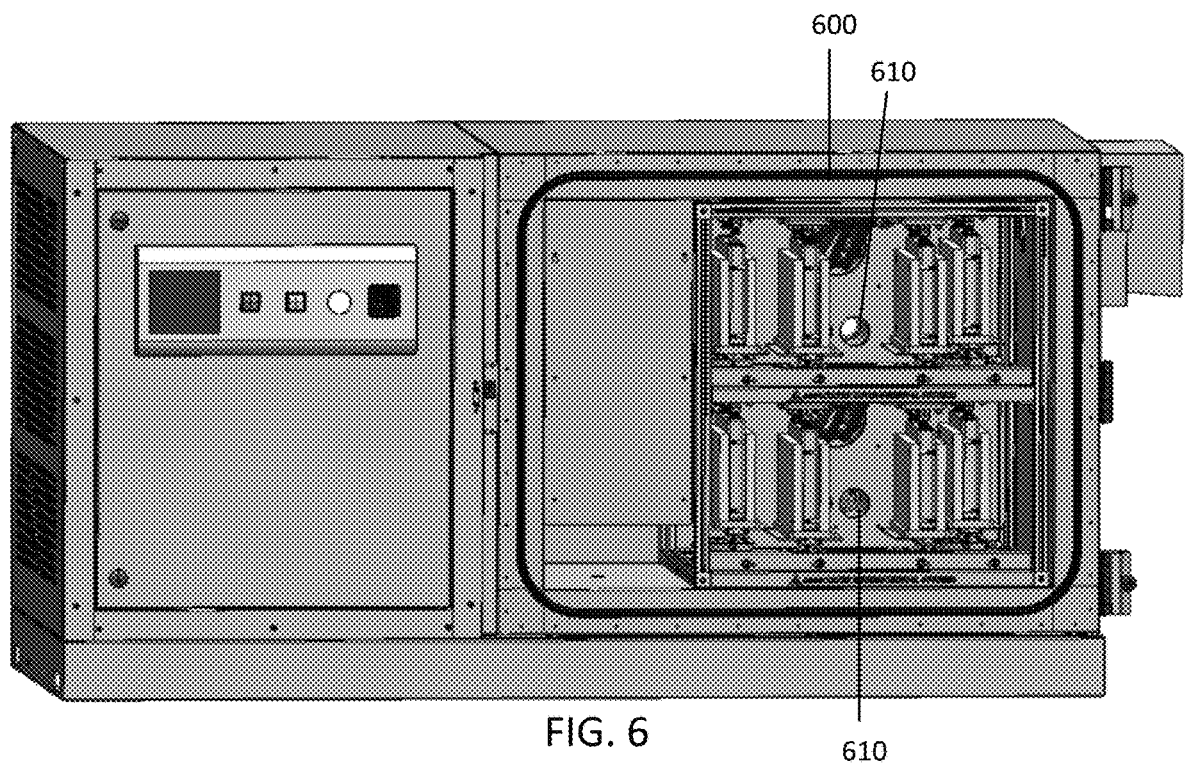
FIG. 6 illustrates a complete system in an environmental test chamber.

Referring to FIGS. 1A & 1B, the ATP Heavy includes a frame 100 that can be configured to support multiple high amperage batteries. The frame may be sized up or down to fit in different testing environments or accommodate different numbers of batteries under test. The ATP Heavy utilizes either stationary or sliding shelves 110 with a number of channels each. Referring also to FIG. 6, conductors exit ports 610 through the rear of the chamber for connection to a battery cycler controlling power during the test. Interchangeable high amperage connection technologies on each shelf provide connections to batteries under test for each channel. The high amperage connection technologies are either manually fastened or spring loaded. The spring loaded connection type can be engaged either manually or pneumatically. For example, an operator can toggle a switch to actuate a pneumatic mechanism to engage/connect the battery to the AES high amperage spring loaded connection.

Flexible Fixture Frame

This allows a system to be adaptable for any number of batteries, different battery form factors, and testing workspaces. The ability to configure the number of batteries, insert them safely, and then connect them to external devices without bulky cabling saves tremendous amounts of time as well as increases battery testing density per square foot of lab space.

The carrier is designed so that the shelving system can be adjusted both by width and height to accommodate different and multiple cell battery sizes. High amperage battery types include, but are not limited to, Prismatic, Pouch, and Cylindrical types. This allows for the testing of various size batteries, providing user flexibility.

Connection Systems

In one embodiment, either manual or pneumatic systems allow all batteries to be placed into the fixture, aligned with the high amperage connection technologies, then either actuated into place or mechanically put into place, making the electrical connection required. Again, speed of connection and safety are the main benefits of this approach, eliminating the need to hand connect thick gauge, hard to manipulate external wiring to the battery to test it.

Figure 2A:
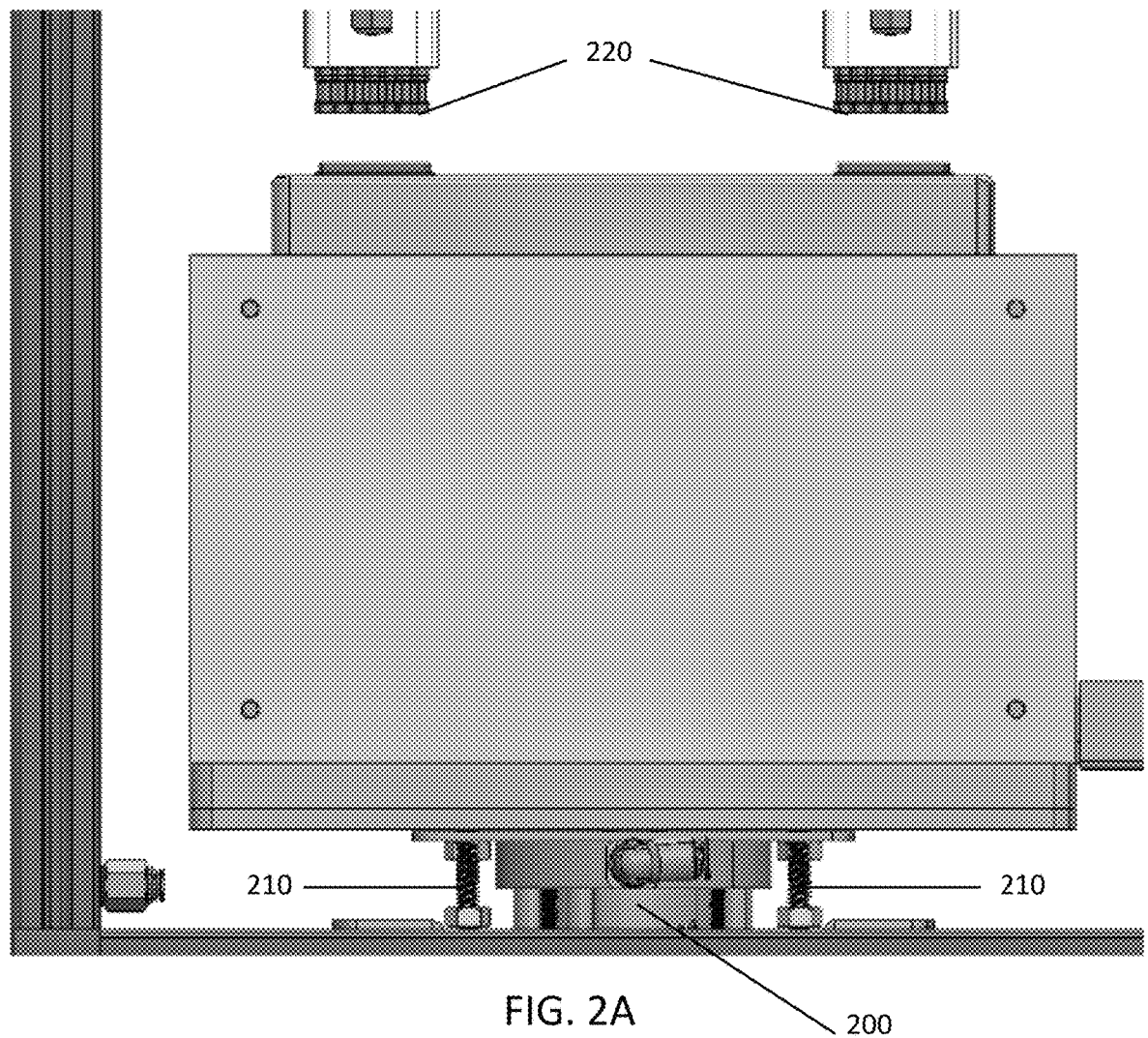
FIG. 2A illustrates the ATP Heavy with a battery and pneumatic lift system in a down and disconnected position.
Figure 2B:
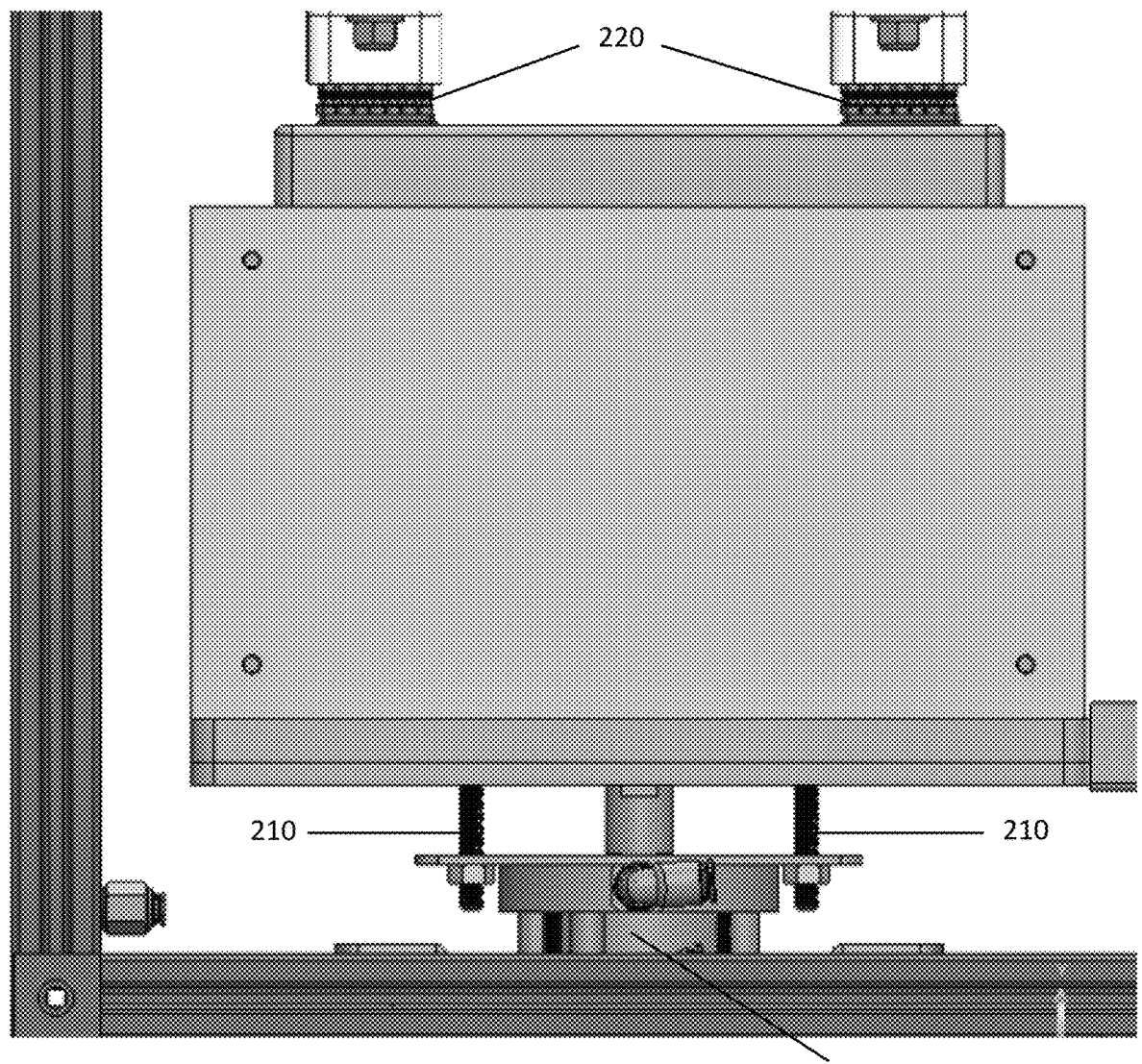
FIG. 2B illustrates the ATP Heavy with a battery and pneumatic lift system in an up and connected position.

Referring also to FIGS. 2A & 2B, the actuation system (pneumatic or manual) moves the battery and/or connection points 220 to make the connection required to power/charge/discharge the battery(s) under test. The advantage of this design feature is that batteries can be added into the fixture, and cumbersome external testing devices can be connected to the ATP heavy, and the battery can then easily, quickly, and safely be connected to the external sources without the need for time consuming and dangerous physical connections. The illustrated pneumatic system 200 uses a low-profile piston capable of lifting even the heaviest batteries. The piston has two glide rods 210 with vertical stops, these keep the battery surface level and provide fine grain height adjustment. Vertical stops also protect the battery from crushing. A specialized air regulator is used to maintain pressure with temperature changes. Adjusting the regulator to a minimal pressure also provides added safety from over compression. The ATP Heavy utilizes pneumatic switches with exhaust flow limiters providing smooth user control without complexity.

Figure 3:
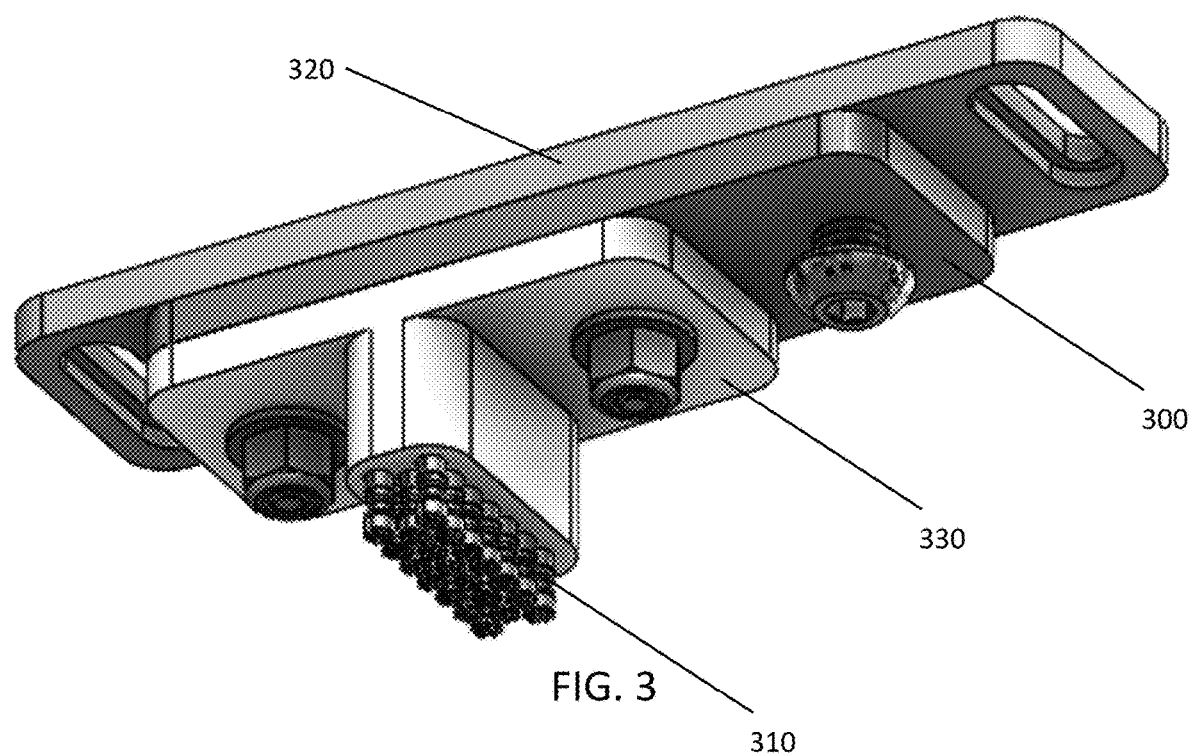
FIG. 3 illustrates the AES pogo pin holder and busbar of the ATP Heavy.
Figure 4A:
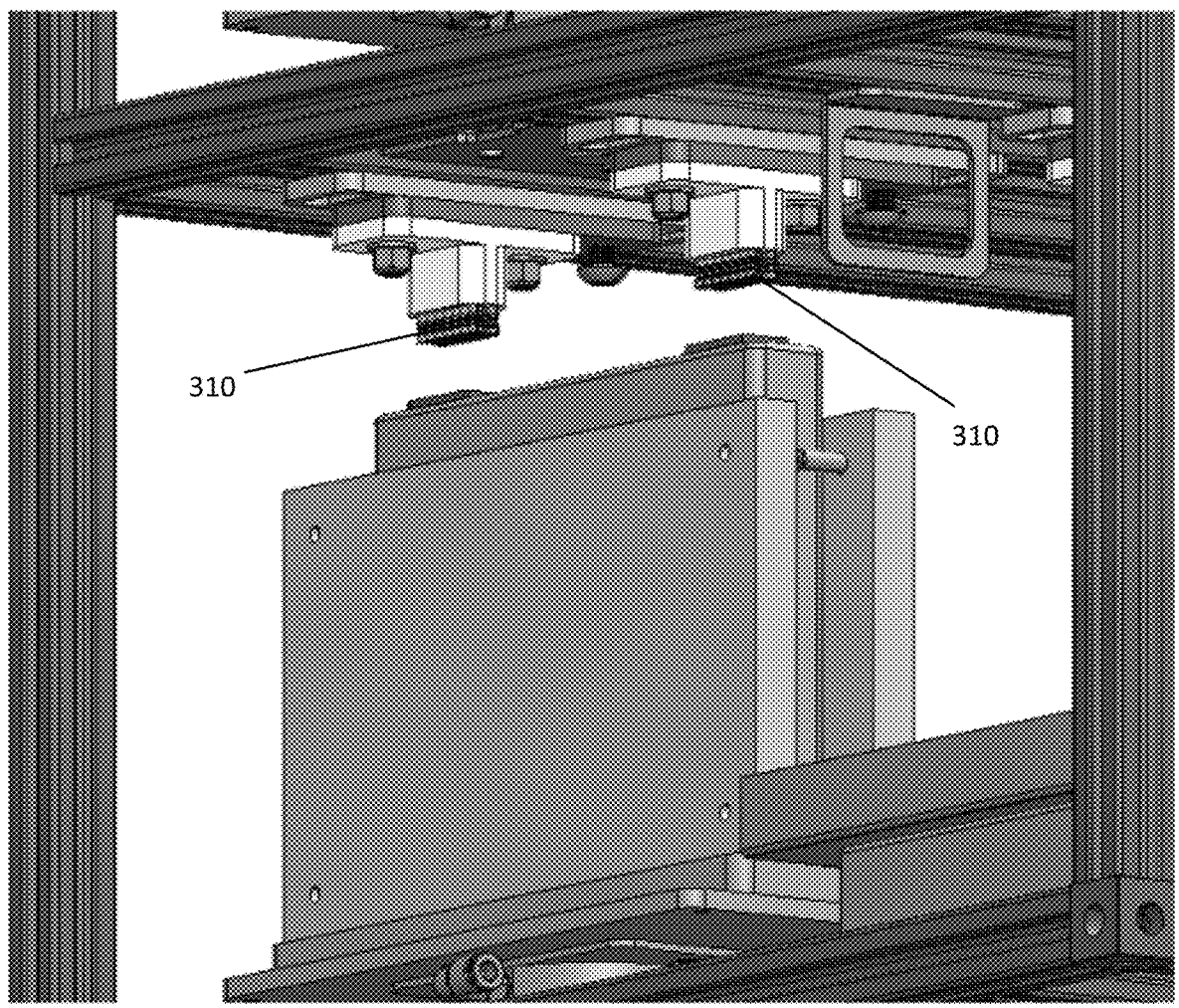
FIG. 4A illustrates the AES pogo pin holders and bus bars within the ATP Heavy above a battery for testing.
Figure 4B:
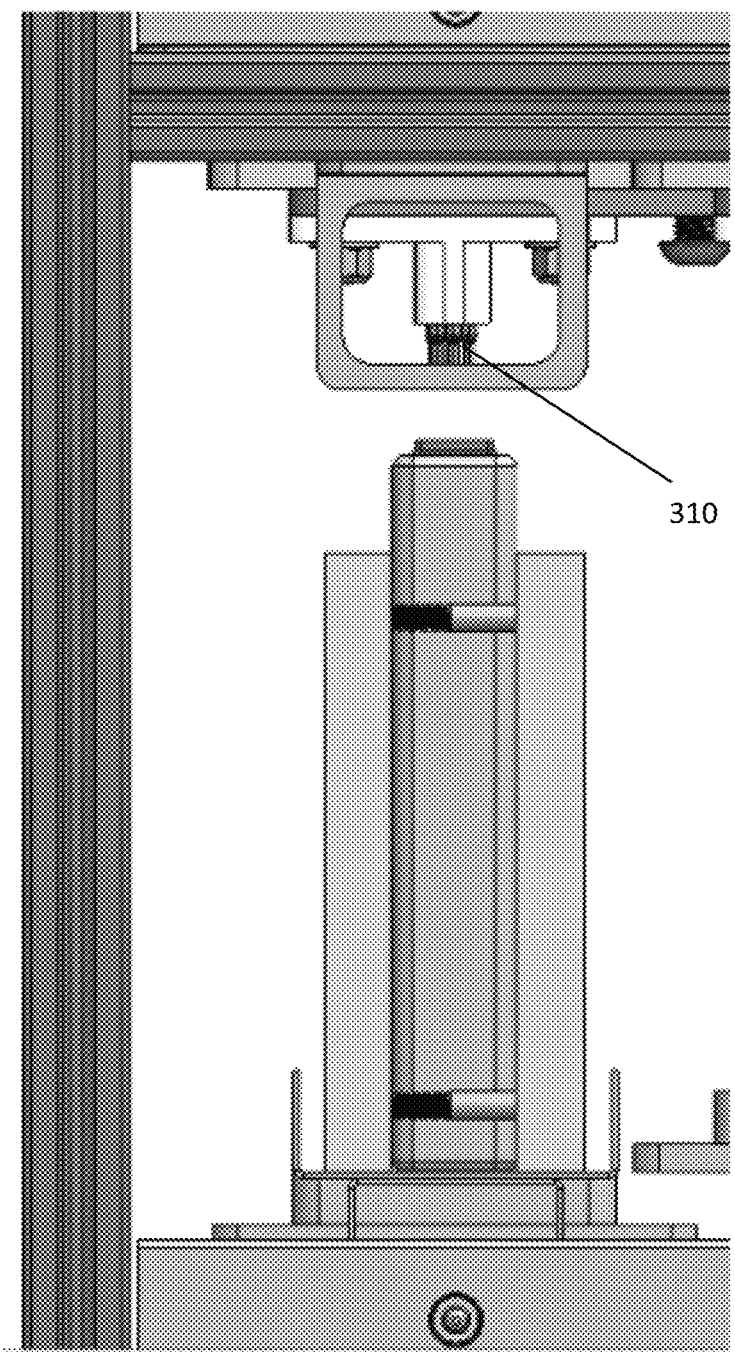
FIG. 4B illustrates a side view of the inserted busbars and battery of FIG. 4A.
Figure 10:
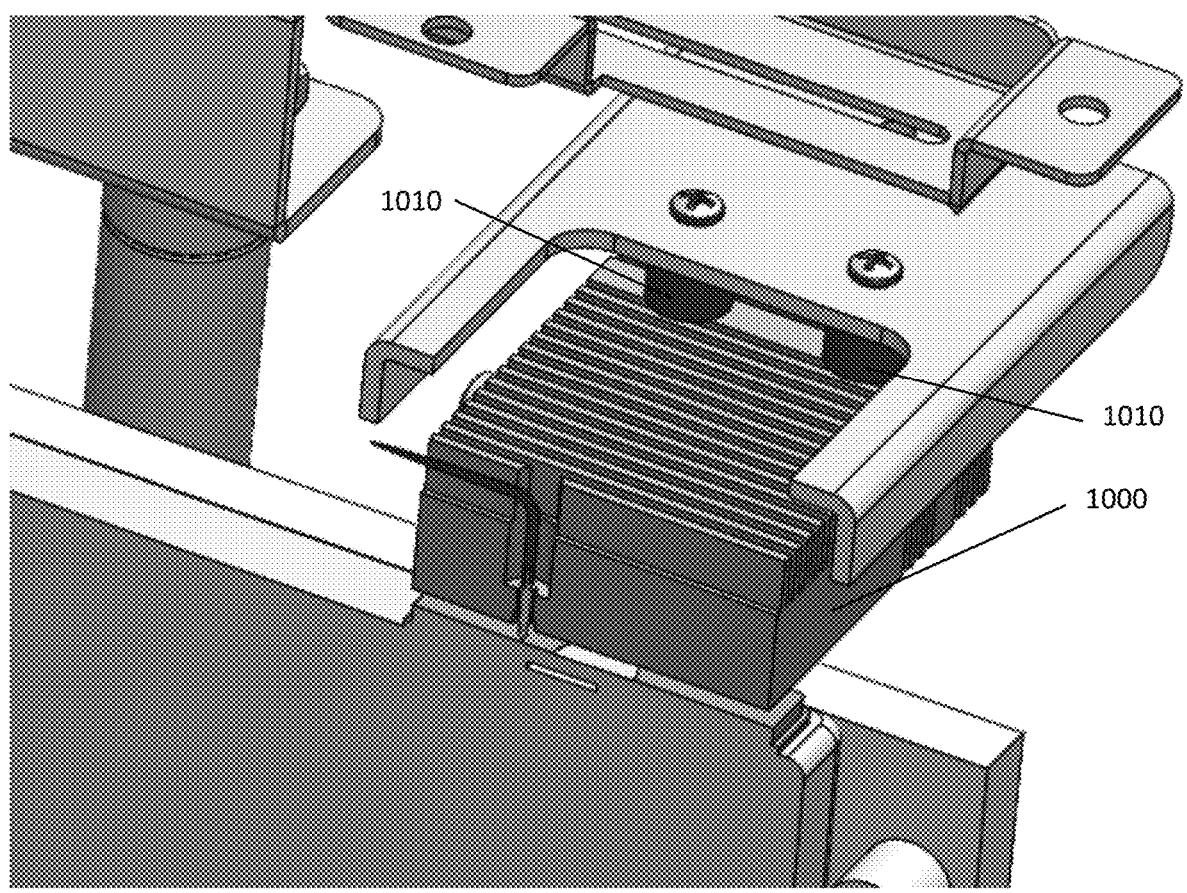
FIG. 10 illustrates a rubber soft-mounted busbar with cross section showing an isolated sense pin.
Figure 12:
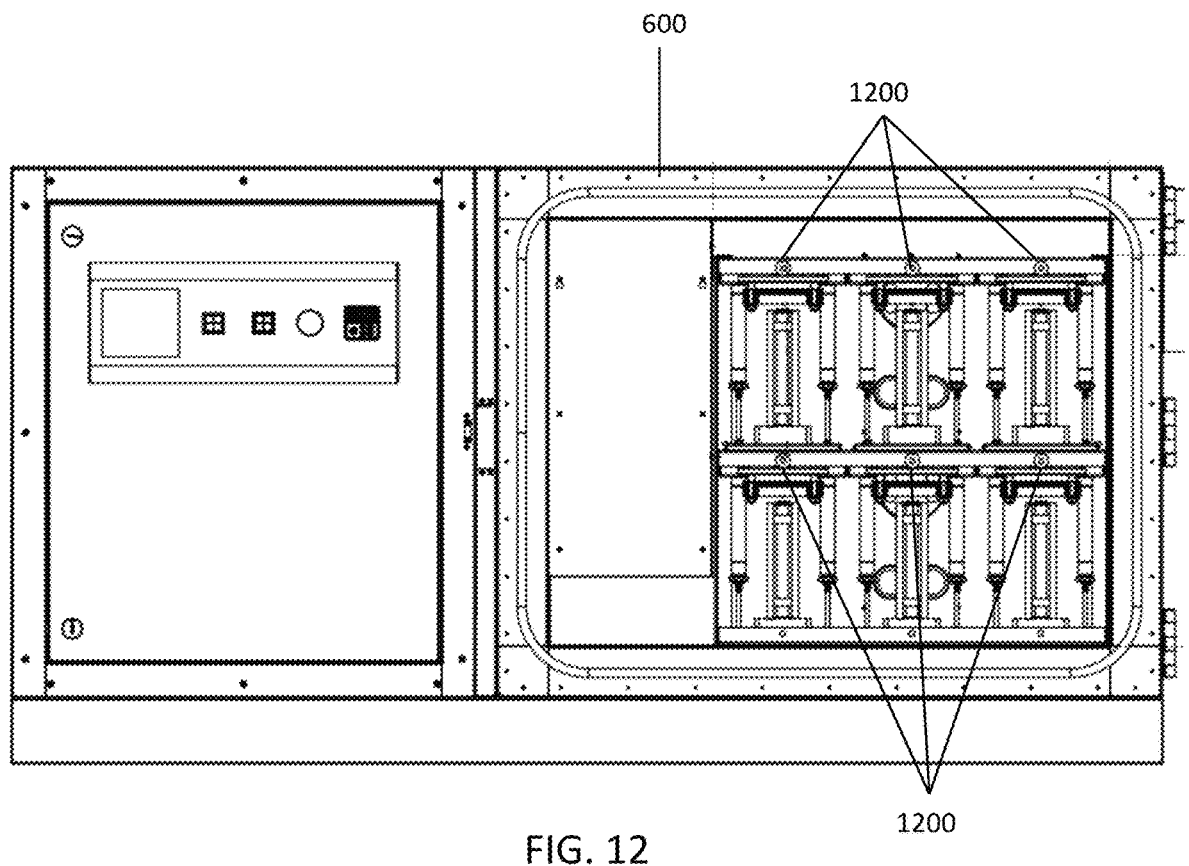
FIG. 12 illustrates a pneumatic system with soft-mounted bus bars within an environmental test chamber.

Referring also to FIGS. 3, 4A, & 4B, a high amperage (typically up to 1000 amps) bus bar mounted above the battery connects the battery to external test sources via a bus bar 300 (typically copper) with an integrated spring-loaded connection. The spring-loaded connection assembly consists of a number of high current spring loaded pins 310 connected to a machined high conductivity copper bar that is preferably gold plated. The number of pins is preferably between 10 and 50. The exact number may be determined by the required current and battery pad size. The use of a spring-loaded connection allows for compensation in height variations due to pad imperfections and/or expansion under test. Referring also to FIG. 10, a soft mounted busbar 1000 may be used when lower resistance and better heat rejection is required. The soft-mounted busbar utilizes low durometer rubber mounts 1010 in each corner, allowing it to move when pressure is applied. The soft-mounted busbar requires a smooth contact surface but is self-leveling when making contact with the battery pad surface. Referring also to FIG. 12, a soft-mounted busbar six channel 1200 configuration is shown in an environmental test chamber 600.

Figure 5:
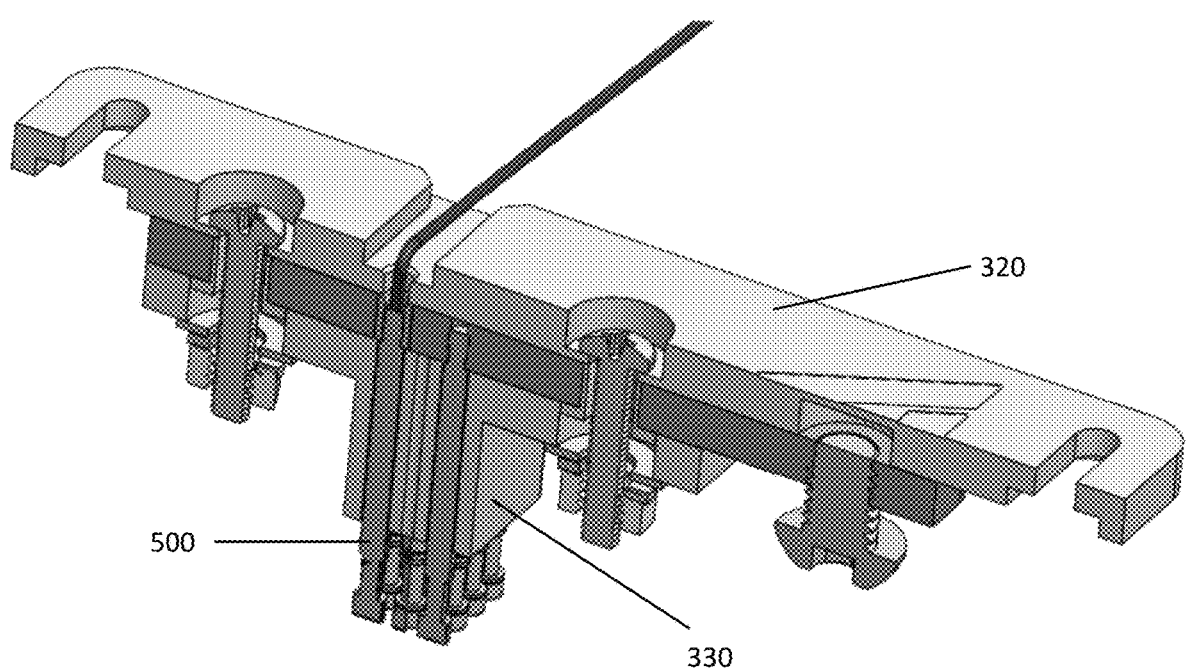
FIG. 5 illustrates the isolation of the sense pin in the AES bus bar.
Figure 11:
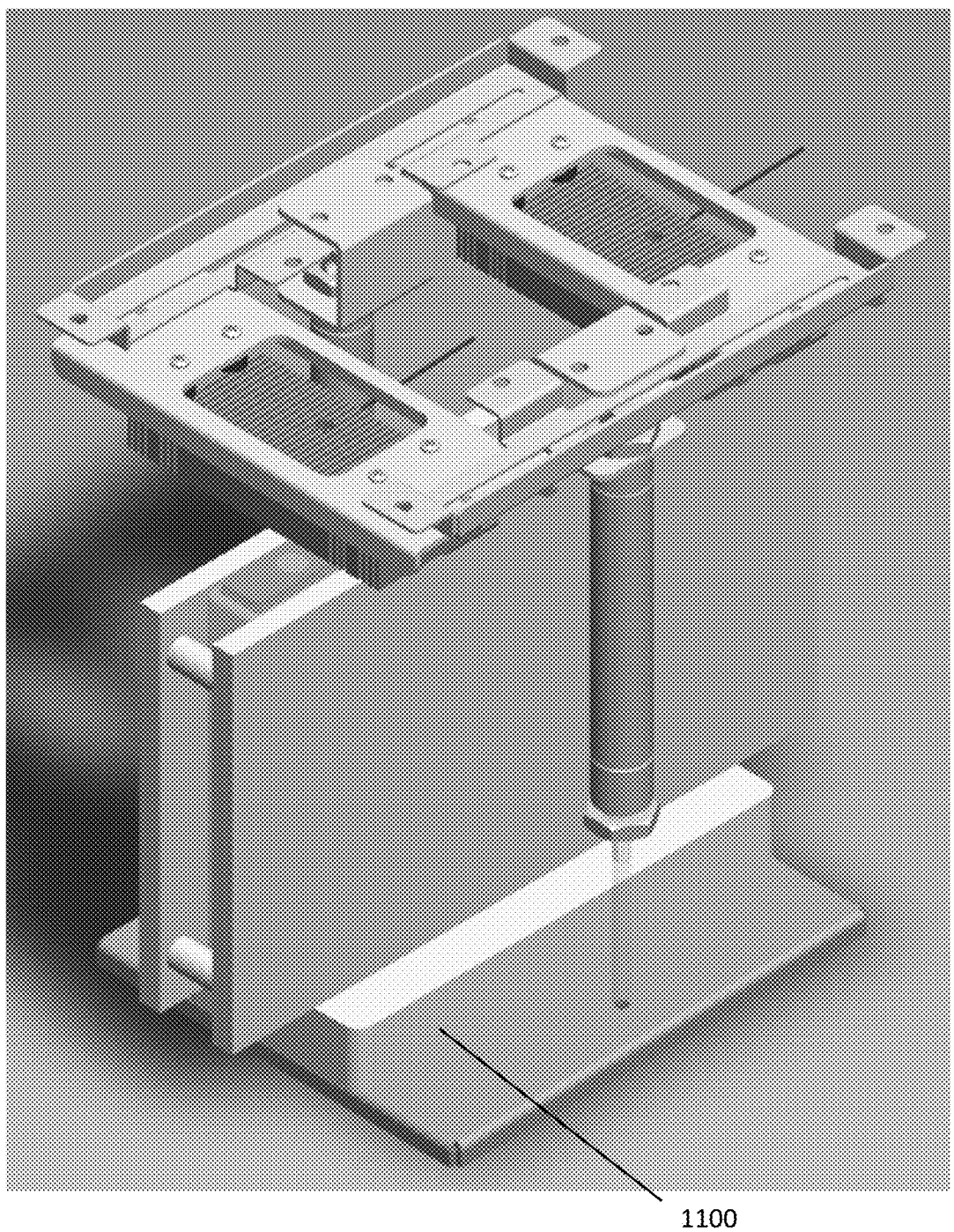
FIG. 11 illustrates a lifting surface with a cooling plate accessory attached.

Referring also to FIG. 5, a single sense pin 500 may be isolated from the bus bar to provide a kelvin connection measurement for the test equipment. The assembly also includes two non-conductive AES isolators which are designed to support the bus bars or pin assemblies. The top mounting isolator 320 allows for adjustment via slots, for various pad distances and locations. The pin support isolator 330 provides support and protection for the spring-loaded pins. The AES isolators increase the safety of the system by separating the bus bars from the frame and limiting exposed conductors. The test surface has mounting provisions for installation of accessories, including risers for short batteries, cooling plates, compression plates, and battery guides to ensure alignment. Referring also to FIG. 11, test surface accessories such as cooling plate 1100 allow for customization to the user's unique testing needs and battery form factor. The batteries under test are inserted while the pneumatics are in the down or open position providing safe clearance for the operator to insert the battery without risking a short. An additional guard is included to prevent an operator from making contact with the pins while loading or unloading. Once inserted, the operator can safely engage the battery.

High Amperage Bus Bar & Cabling

The bus bar or cable provides a low loss interconnect between the battery connection system and heavy gauge external cabling. This includes an internal mechanically fixed termination point, preventing any force from the stiff cabling from affecting the connection. Referring also to FIG. 6, cables are routed in the test chamber 600 to optimize air flow to the battery and prevent excessive self-heating in the cables. Cables are selected to optimize flexibility, temperature range, and electrical requirements. These cables are secured out of the way of user operation improving safety.

These conductors consist of both current carrying and voltage measurement conductors. For current carrying conductors, a low resistance must be maintained for the tester to work properly. A typical test system can compensate for voltage drop to the battery using a kelvin connection, but this overhead is limited. A resistance budget is established using the full system resistance to ensure support with testers. The system is designed to achieve this resistance budget in a repeatable fashion.

Fixed High Amperage External Connectivity Cabling Solution

Once outside the chamber, the user needs to attach the ATP Heavy with the test equipment. This test equipment uses heavy gauge cables, and often multiple per polarity. To achieve this, an interface is created on the back of the chamber providing a safe and organized method of connection. Either a bus bar or large format connector/terminal post is used for current carrying conductors, while standard connectors are used for voltage measurement.

Figure 7:
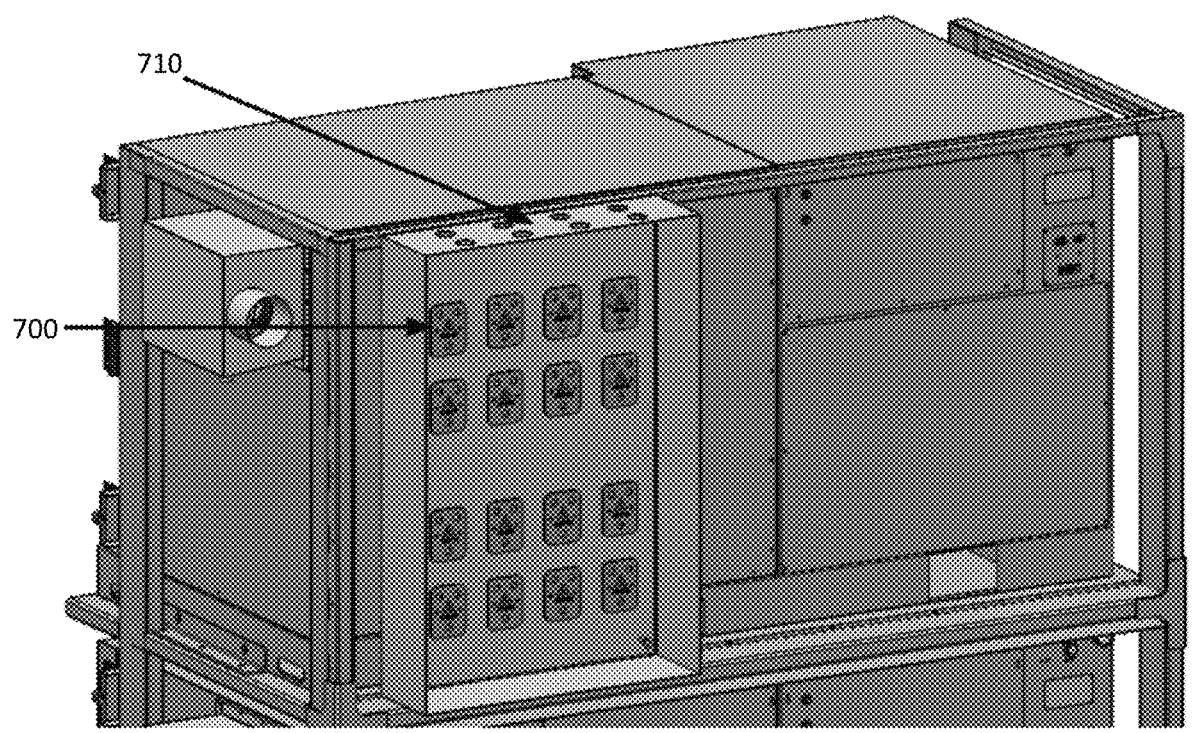
FIG. 7 illustrates the tester cabling interface in the back of a chamber.

Referring also to FIG. 7, this system uses a copper bar to interface the ATP Heavy with four 4/0 cables per channel in a safe and low resistance connection. There is a multi-cable interface connector 700 to provide the voltage measurement conductors to the testers cabling. This is all housed in a connection box 710 to prevent any accidental contact. These systems are designed to best optimize room layout and cable management.

Other Embodiments

Larger Form Factors (Fixtures in Containers)

As batteries continue to grow, so may the ATP Heavy. While initially focused on up to 64 cubic feet designs, the system is flexible and may be used in large structural walk-in rooms, including container based systems. These systems include provisions for lifting mechanisms including cranes and forktrucks. These systems also include track systems to facilitate removal of the DUT (device under test).

Automation

As testing of batteries matures and volume increases, automation is increasingly critical to success. The ATP Heavy may tightly integrate with automation systems including robotic loading and unloading. The fixture may provide blind mating, positional tracking indicators, and anchor points. Remote control of battery actuation may enable fully autonomous operation. Automatic detection of battery and verification of placement may prevent fixture damage or failed tests.

High Currents

As batteries get larger, their current requirements also increase. The ATP Heavy may support increased current through actively cooled cables and a chilled water loop for battery cooling integrated into chamber refrigeration. New connection methods may integrate to support the new form factors and pads of these high current batteries.

BMS Communications and Sensors

To better support battery packs, the ATP Heavy may include support of I2C, HDQ, SMB, and other communication protocols used in battery management systems (BMS). This integrated solution may allow for remote monitoring of battery packs during tests. Typically these protocols are short range. By integration into the ATP Heavy, a long distance protocol may be used to prevent signal loss. The ATP Heavy may also integrate temperature sensor inputs internal to the chamber to allow for users to easily add and remove temperature sensors without running additional wires.

ATP Heavy Adaptable

Figure 8:
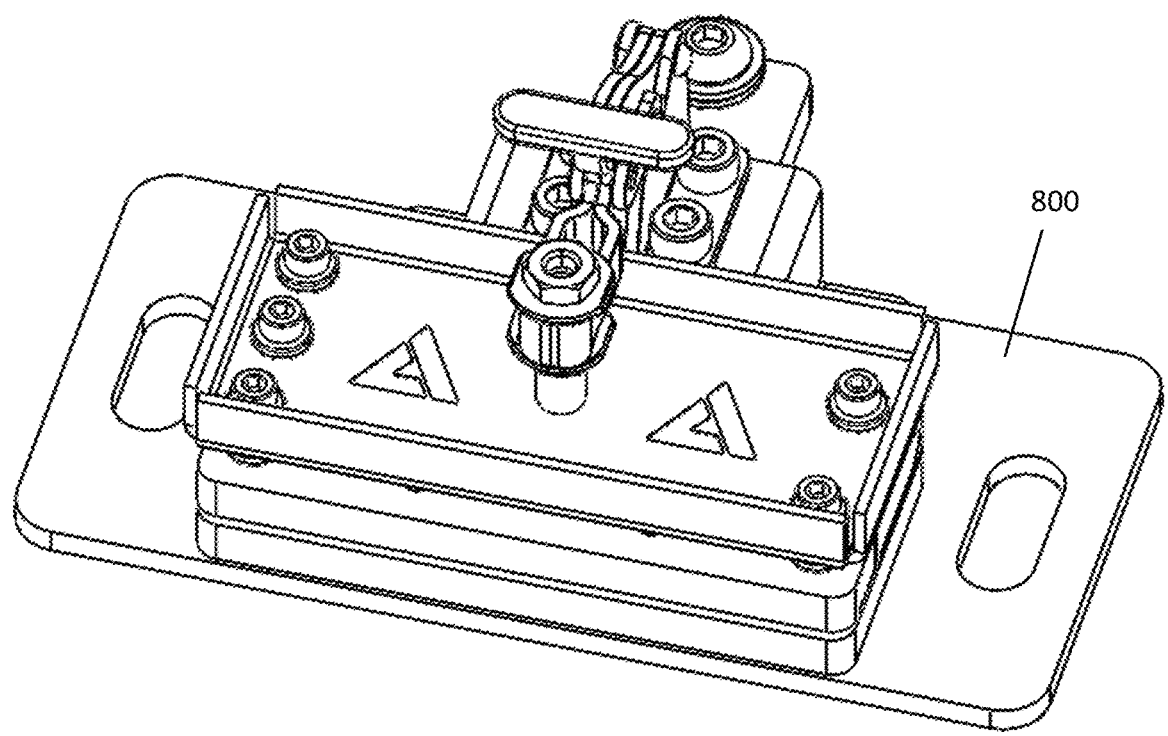
FIG. 8 illustrates a flat bus bar.
Figure 9:
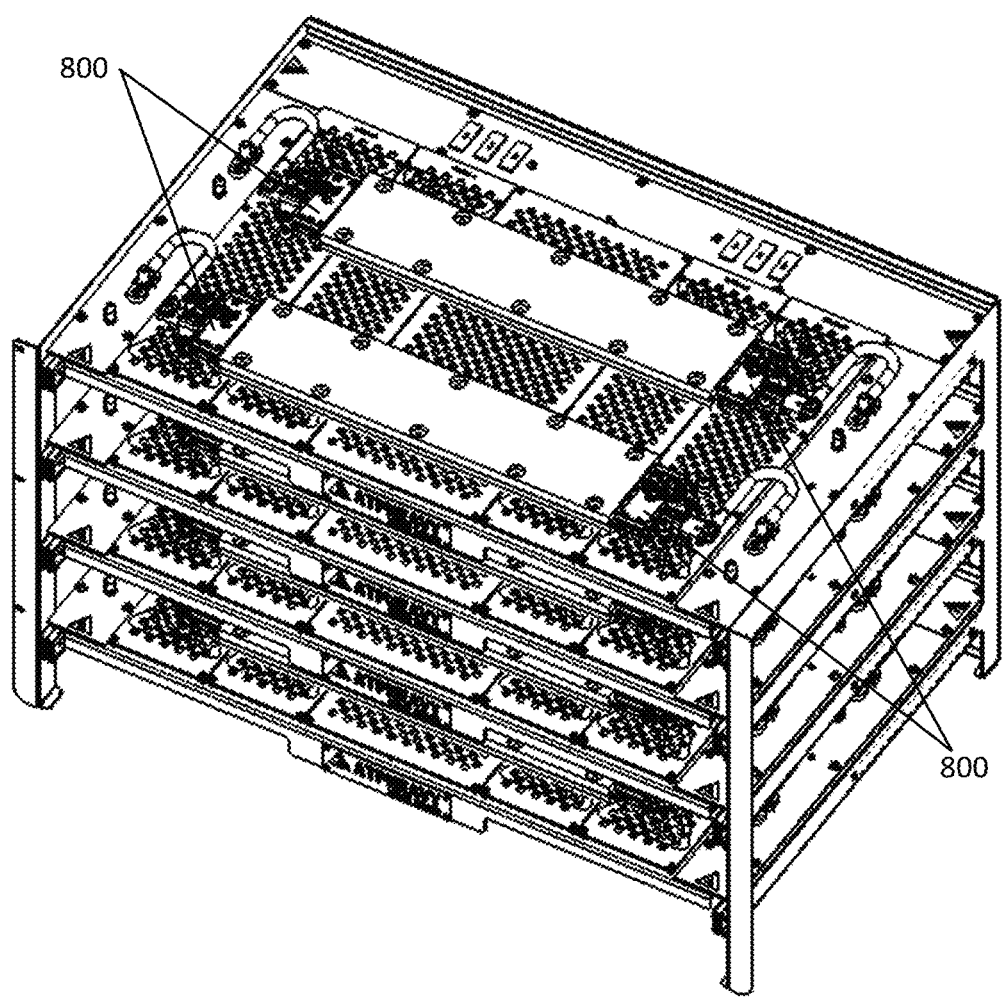
FIG. 9 illustrates an embodiment of the ATP Heavy with shelves for battery connection to the flat bus bar of FIG. 8.
Figure 13:
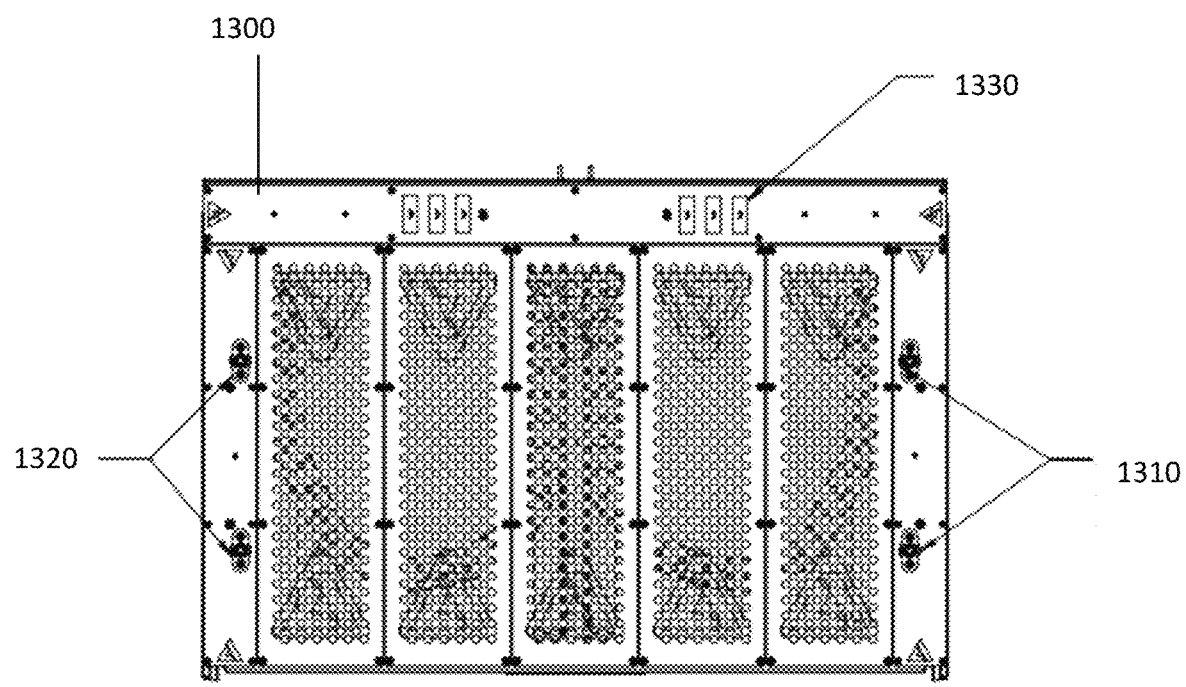
FIG. 13 illustrates an ATP Heavy Adaptable in a 250A configuration.
Figure 14:
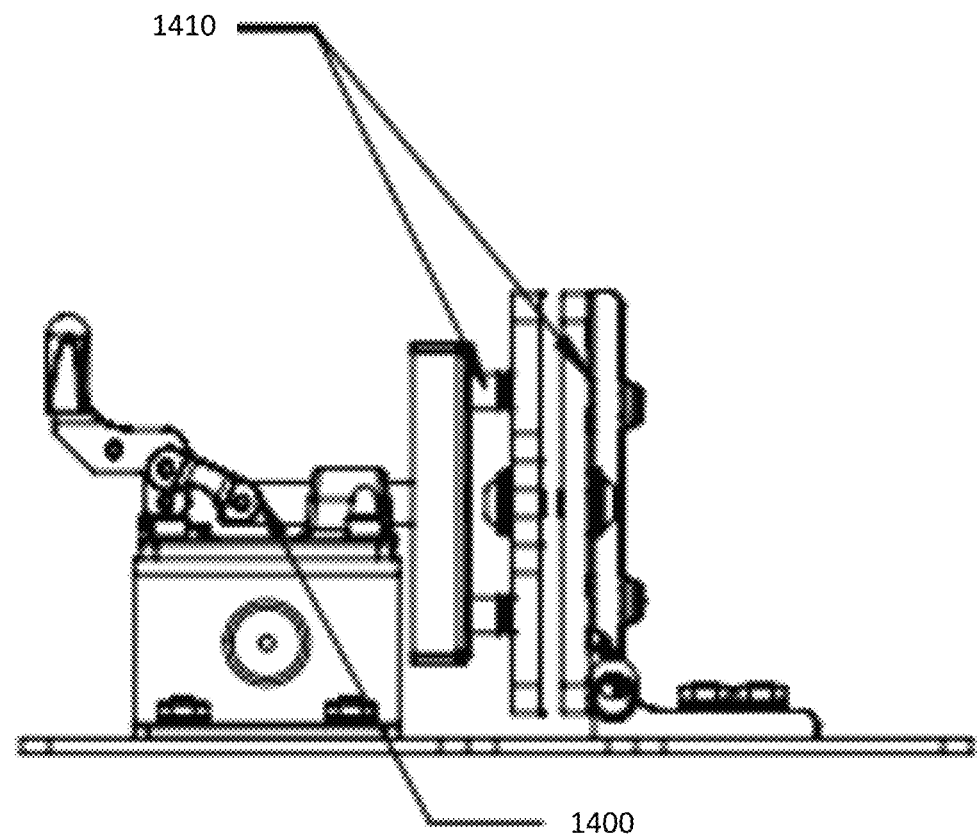
FIG. 14 illustrates a 500A vertical clamp for an embodiment of the ATP Heavy Adaptable.
Figure 15A:
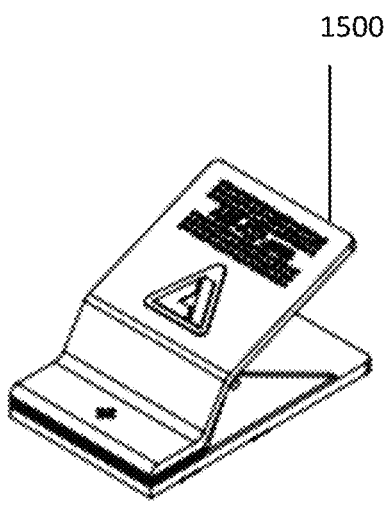
FIGS. 15A & 15B illustrate a 100A rail-mountable clip for an embodiment of the ATP Heavy Adaptable.
Figure 15B:
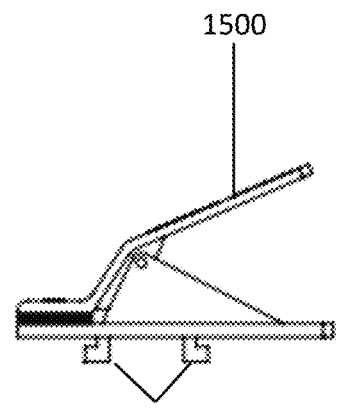
Figure 16:
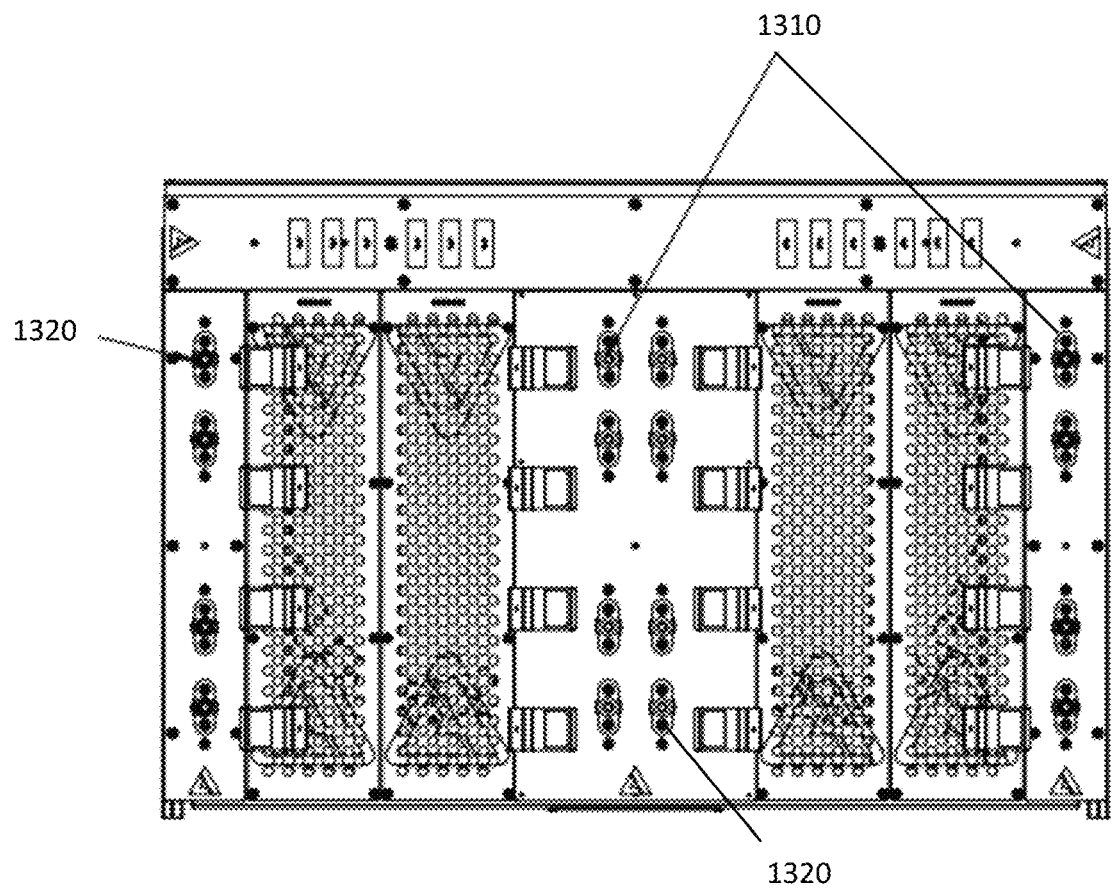
FIG. 16 illustrates an embodiment replacing two center plates with additional terminals for an increased channel count.

Referring also to FIG. 13, an alternate embodiment may be used instead of using the pneumatic lift to connect batteries to spring-loaded pins. This system comprises up to four sliding shelves 1300 with high current conductors in a moving track and universal connectors on the top of the shelf surface. Multiple connection method types can then be attached to the perforated test surface, depending on the battery type, size, and current requirements. For example, positive distribution posts 1310 may be on one side, and negative distribution posts 1320 on another side. Thermo couple jacks 1330 may also be included. Referring also to FIG. 14, one example connection method is a vertical clamp 1400 with mechanically latched flat busbars supporting up to 500 A and positioned with isolation mounts and spacers 1410. Two gold plated copper bars sandwich the battery tab for the lowest possible contact resistance. A third and smaller copper bar with an isolator is used for an isolated sense connection. Referring also to FIG. 8, in a closed configuration the clamp mechanically latches flat busbar 800 to the battery. Referring also to FIG. 9, up to four connections, such as through flat busbars 800, may be included per shelf, allowing up to eight large cells to be tested simultaneously across four shelves, or cells may be combined allowing testing up to 500 amps per channel. Referring also to FIGS. 15A & 15B, another connection method may incorporate 100A spring loaded kelvin clips 1500, which may include rail mounts 1510. The perforated test surface of 3 to 5 non-conductive plates allows connections to be placed anywhere on the surface allowing user customization if requirements change over time. These plates can also be interchanged to support different channel counts or accessories. Referring also to FIG. 16, in one example the two center plates may be replaced with additional channels to support up to 8 high current channels per shelf. For example, the number of positive distribution posts 1310 and negative distribution posts 1320 may be doubled with this configuration. Shelves may also be removed to accommodate different size batteries.

It is to be understood that the above description is intended to be illustrative, and not restrictive. Many other embodiments will be apparent to those of skill in the art upon reviewing the above description. The scope should, therefore, be determined with reference to the appended claims, along with the full scope of equivalents to which such claims are entitled.

What is claimed is:

1. An adjustable fixture for testing batteries within an environmental test chamber, comprising:
   a flexible fixture frame sized to fit within the environmental test chamber;
   one or more shelves within the frame;
   one or more channels per frame;
   one or more high amperage connection points mounted above the one or more shelves and aligned for vertical connection to one or more batteries; and
   one or more conductive cables connected to respective high amperage connection points and routed out an exit port of the environmental test chamber.

2. The fixture of claim 1, wherein the shelves are fixed stationary within the frame.

3. The fixture of claim 1, wherein the shelves slide within the frame.

4. The fixture of claim 1, wherein the shelves are adjustable within the frame to accommodate different height and width battery types.

5. The fixture of claim 1, further comprising an actuation system configured to connect one or more batteries under test to the high amperage connection points.

6. The fixture of claim 5, wherein the actuation system includes a pneumatic lift.

7. The fixture of claim 6, wherein the pneumatic lift includes a piston with two glide rods having vertical stops.

8. The fixture of claim 1, wherein each respective connection point is a high amperage bus bar with an integrated spring-loaded connection mounted above the respective shelf.

9. The fixture of claim 8, wherein each high amperage bus bar includes one or more high current spring loaded pins connected to a copper bar.

10. The fixture of claim 9, wherein each high amperage bus bar further includes a top mounting isolator adjustable via one or more slots for configurable distances and locations within the frame.

11. The fixture of claim 10, wherein each high amperage bus bar further includes a pin support isolator protecting the one or more spring-loaded pins.

12. The fixture of claim 11, wherein each high amperage bus bar further includes a single spring-loaded pin providing a kelvin connection.

* * * * *